United States Patent [19]

Schucht

[11] 4,107,630

[45] Aug. 15, 1978

[54] PULSE-MODULATED HIGH-FREQUENCY TRANSMITTER

[75] Inventor: Peter Schucht, Munich, Germany

[73] Assignee: Siemens Aktiengesellschaft, Berlin & Munich, Germany

[21] Appl. No.: 833,489

[22] Filed: Sep. 15, 1977

[30] Foreign Application Priority Data

Oct. 27, 1976 [DE] Fed. Rep. of Germany ....... 2648767

[51] Int. Cl.$^2$ .......................... G01S 7/28; H03B 5/18; H03K 7/08
[52] U.S. Cl. .................... 332/9 T; 307/106; 325/141; 325/169; 331/96; 331/117 D; 331/173; 343/17.1 R
[58] Field of Search ............ 332/9 T, 9 R; 325/38 R, 325/43, 44, 141, 142, 143, 169; 343/17.1 R, 17.1 PF; 331/96, 117 D, 173; 307/106

[56] References Cited

U.S. PATENT DOCUMENTS 3,716,854  2/1973  Charlot, Jr. ............... 331/173 X

OTHER PUBLICATIONS

Hodowanec "Microwave Transistor Oscillators", Microwave Journal, vol. 17, No. 6, pp. 39–42, 62.

Primary Examiner—Siegfried H. Grimm
Attorney, Agent, or Firm—Hill, Gross, Simpson, Van Santen, Steadman, Chiara & Simpson

[57] ABSTRACT

A pulse-modulated high-frequency transmitter is pulse keyed and has a high pulse power. A self-sustained transistor oscillator has a grounded base with a collector-emitter feedback in the form of a strip line with a length of half a wavelength and a serially-connected capacitor. A pulse modulator connected to the oscillator includes an output stage constructed as a constant current source which is keyed by a pulse generator.

3 Claims, 2 Drawing Figures

4,107,630

PULSE-MODULATED HIGH-FREQUENCY TRANSMITTER

BACKGROUND OF THE INVENTION

1. Field of the Invention

The invention relates to a pulse-modulated high-frequency transmitter which is keyed by a pulse and is provided for high pulse power, and which employs a transistor oscillator.

2. Description of the Prior Art

Known pulse-modulated transmitters, e.g. for radar installations, in particular secondary radar installations, which emit power in the order of a few hundred watts, have heretofore been constructed employing elaborate amplifier chains whose output stages are decoupled via hybrids and then connected in parallel at input and output. These amplifier chains are driven by a low-power oscillator.

SUMMARY OF THE INVENTION

The object of the invention is to provide a transistor transmitter circuit which is suitable for pulse modulation, which does not require expensive amplifier stages and in which the transistors employed are protected from thermal overload and mismatching, so that a high degree of reliability is ensured.

In accordance with the invention, which relates to a high-frequency transmitter of the type described above, this object is realized in that a self-sustained oscillator possesses a feedback circuit which is arranged between the collector and the emitter of the transistor and which consists of the series arrangement of a strip line having a length of half a wavelength, and of a capacitance, and which operates in addition to the internal transistor feedback, and that the keying of the oscillator is effected via the emitter of the transistor by a pulse modulator whose output stage is connected as a constant current source which is keyed by a pulse generator. The constant current source forces a constant current through the transistor of the transmitter, independently of the collector voltage and of the output-coupled power, so that the transistor of the oscillator is protected against heat overload and its operative point is maintained stable.

The transmitter circuit provided with the self-sustained, pulse-modulated oscillator in accordance with the invention also provides an improved pulse shape, a lower phase modulation and a lower current consumption than the known circuits provided with amplifier chains.

An advantageous further development of the invention resides in the fact that the transistor is connected in parallel with one further transistor, or a plurality of further transistors, in respect of a.c. voltage, and that the d.c. voltage keying of the transistors is in each case carried out across the emitters from separate constant current sources which, however, are keyed by the same pulse generator. When a plurality of transistors are connected in parallel, which serves to allow a higher output power, the decoupling hybrids required when amplifier chains are used are not required.

The transmitter circuit constructed in accordance with the invention facilitates the construction of small and cost-favorable semiconductor transmitters having an output power of several hundred watts, e.g. with power transistors which individually emit a maximum high frequency power of only 250 W.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
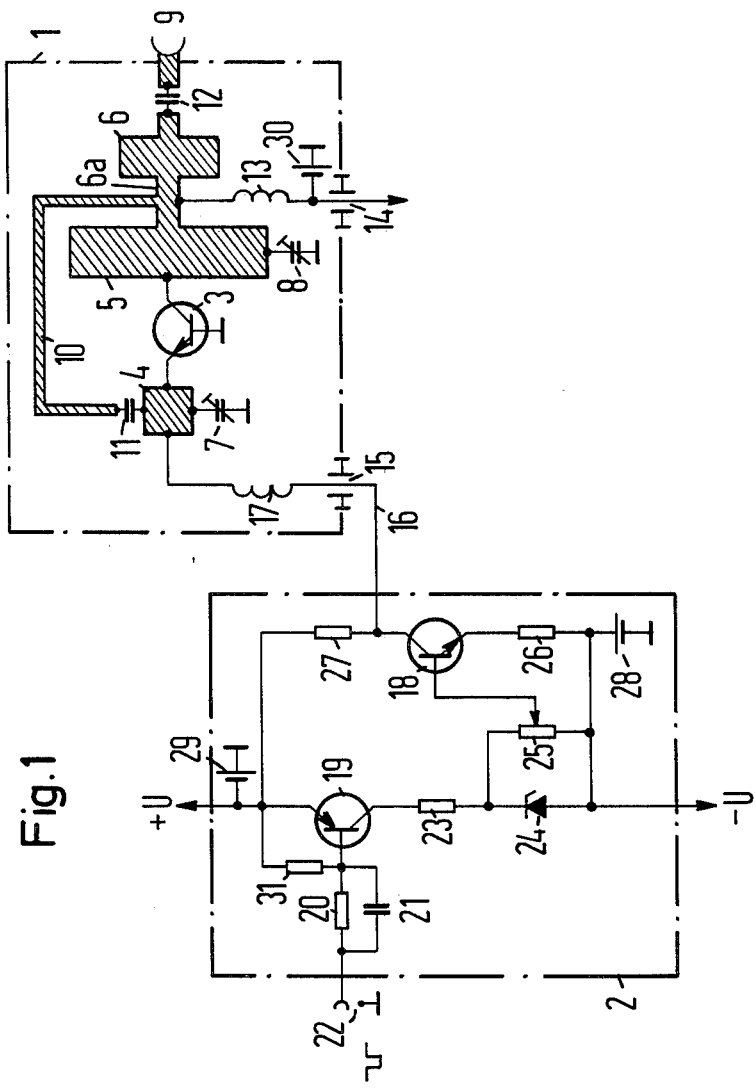
FIG. 1 is a schematic circuit diagram of a first embodiment of the invention.

FIG. 1 is a schematic illustration of the circuit of a secondary radar transmitter, which emits a 50 W pulse power, and is provided for frequencies from 1 – 1.1 GHz, with a self-sustained oscillator 1 and a modulator 2. The oscillator 1, which is designed in the strip line technique, possesses a Hf-power transistor 3 which is operated in a grounded base configuration, with a capacitive, emitter-end line portion 4, and with two collector-end conductor surfaces 5 and 6 with a connection line 6a therebetween, which represents an output matching network operating over a wide band. An emitter-end capacitance 7 and a collector-end capacitance 8 are designed as trimmer capacitors.

Matching can be optimized by means of the capacitance 8. The wide-band matching network transforms the desired, complex load resistance of the transistor 3 to the standardized line resistance at the output 9. The frequency-determining resonant circuit of the oscillator 1 is formed by the internal inductance of the emitter supply line of the transistor 3 and the capacitance of the trimmer capacitor 7, which is connected to ground and permits tuning within the frequency range from 1 GHz to 1.1 GHz. The feedback of the oscillator between the collector and the emitter of the transistor 3 is carried out internally in the transistor 3 and, in addition, via a strip line 10 having a length of approximately half a wavelength and via a capacitance 11 connected in series therewith.

The signal for the antenna, or possibly for an amplifier stage, is withdrawn via a capacitor 12 at the output 9. The capacitor 12 blocks the operating voltage from the output 9. The supply of operating d.c. voltage for the transistor 3 is provided via a high frequency choke 13 and a feedthrough capacitor 14. A capacitor 30 designed as switch-resistant electrolytic capacitor supplies the requisite pulse flow for the transmitter, e.g. and a.c. ground.

The oscillator 1 is keyed via the emitter of the transistor 3 by the modulator 2 by means of a keying line 16 which leads through a feedthrough capacitor 15. A high-frequency choke 17 is also connected into this keying line 16. In order to provide the transistor 3 of the oscillator 1 with a protection against thermal overload, and to maintain its operative point stable, the output stage of the modulator 2, which stage is connected to a transistor 18, is designed as a keyed constant current source. The pulsed modulator input voltage is supplied to a modulator first stage transistor 19 via a parallel arrangement of a series base resistor 20 and a capacitor 21. The input for the modulator input voltage is referenced 22.

The collector of the first stage transistor 19 is connected via a resistor 23 to a Zener diode 24 across which the constant Zener voltage drops when the transistor 19 switches through in response to a pulse being present at the input 22. The Zener diode 24, which thus represents a pulse-controlled constant voltage source, is connected in parallel with an adjustable voltage divider 25, having a tap which is connected to the base of the modulator output stage transistor. Thus, when the modulator 2 is keyed at the input 22, the transistor 18, which at its emitter is connected to a resistor 26 and at its collector to a resistor 27, is rendered conductive. A constant current flow in the collector of the transistor 18, which is fundamentally independent of the collector voltage and the feedback across the transistor 3, and is also independent of the power output-coupled at the output 9, is maintained by means of the emitter resistor 26 of the transistor 18, when its base is operated in constant fashion. Two capacitors in the modulator 2 are referenced 28, 29, a resistor between the base and the emitter of the transistor 19 is referenced 31, and the operating voltage for the two transistors 18 and 19 is referenced +U. The requisite constant current in the keying line 16 can be set up by means of the voltage divider 25.

Figure 2:
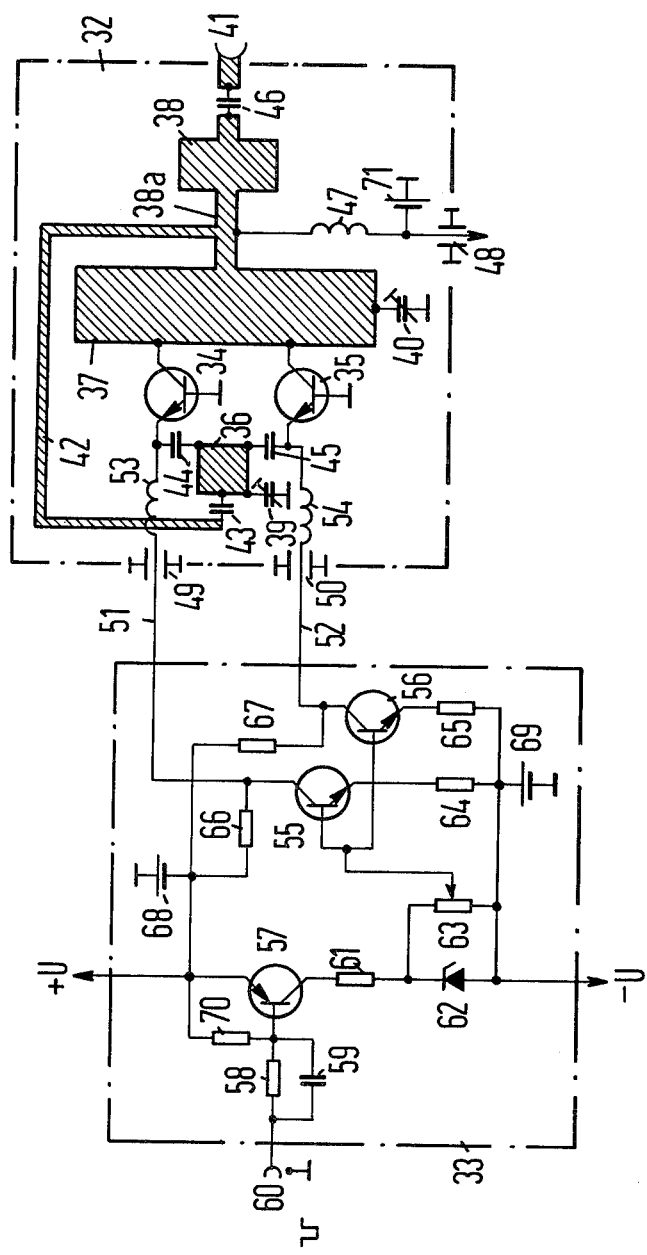
FIG. 2 is a schematic circuit diagram of a second embodiment of the invention.

FIG. 2 illustrates the circuit of a secondary radar transmitter which emits 200 W pulse power, likewise for frequencies from 1 – 1.1 GHz, with a self-sustained oscillator 32 and a modulator 33. The oscillator 32 which is designed in the strip line technique contains two Hf-power transistors 34 and 35 which are operated in a grounded base connection, with a capacitive, emitter-end, surface line portion 36, and with two collector-end conductor surfaces 37 and 38 with a connection line 38a therebetween, which form an output matching network operating over a wide band. Trimmer capacitors are provided for an emitter-end capacitance 39 and a collector-end capacitance 40. The matching can be optimized by means of the capacitance 40. The wideband matching network transforms the desired, complex load resistance of the transistors 34 and 35 to the standardized line resistance at the output 41. The frequency-determining resonant circuit of the oscillator 32 is formed by the internal inductance of the emitter supply lines of the transistors 34 and 35 and via the capacitance of the trimmer capacitor 39 which is connected to ground. The trimmer capacitor 39 permits a tuning within the frequency range from 1 GHz to 1.1 GHz. The feedback of the oscillator 32 between the collectors of the transistors 34 and 35, on the other hand, is carried out internally in the transistors 34 and 35 and furthermore, via a line 42 having a length of approximately half a wavelength, and via a capacitance 43 in series therewith. The transistors 34 and 35 are connected in parallel in respect of a.c. voltage, due to the fact that two capacitors 44 and 45 have been used. The signal for the antenna, or possibly for an adjoining amplifier stage, is withdrawn via a capacitor 46 at the output 41. The supply of the operating d.c. voltage for the transistors 34 and 35 which is blocked from the output 41 by means of the capacitor 46, is provided via a high-frequency choke 47 and a feedthrough capacitor 48. A capacitor 71, which is advantageously designed as switch-resistant electrolytic capacitor, supplies the pulse flow required for the transmitter.

The oscillator 32 is keyed via the emitters of the transistors 34 and 35 by the modulator 33 by means of two keying lines 51 and 52 which each lead through a feedthrough capacitor 49, 50 respectively. A high-frequency choke 53, 54 is also connected into each of the keying lines 51, 52. In order to protect the transistors 34 and 35 of the oscillator 32 from thermal overload, and to maintain their operative points stable, the output stages of the modulator 33, which are each connected to a transistor 55, 56 respectively are designed as keyed constant current sources. Thus, the two transistors 34 and 35 of the oscillator 32 are connected in parallel in respect of a.c. voltage, but are operated and stabilized separately in respect of d.c. voltage via the two constant current sources which are equipped with transistors 55, 56, respectively. The pulsed modulator input voltage is supplied to a modulator first stage transistor 57 via a parallel arrangement composed of a base series resistor 58 and a capacitor 59. The input for the modulator input voltage is referenced 60. The collector of the first stage transistor 57 is connected via a resistor 61 to a Zener diode 62 across which the constant Zener voltage drops on the switch-through of the transistor 57 when a pulse is present at the input 60. The Zener diode 62 which represents a pulse-controlled constant voltage source is connected in parallel with an adjustable voltage divider 63 having a tap which is connected to the bases of the two modulator output stage transistors 55 and 56. When the modulator 33 is keyed at the input 60, the transistors 55 and 56 which across their emitters are connected to resistors 64, 65 respectively and across their collectors are connected to the resistors 66, 67 respectively are thus rendered conductive. A constant collector current of the transistors 55 and 56, which is independent of the collector voltage and the feedback across the transistors 34 and 35, and which is also independent of the power output-coupled at the output 41, is maintained by means of the emitter resistors 64 and 65 when the bases of these two transistors are operated in a constant manner. The requisite constant current in the two keying lines 51 and 52 can be commonly adjusted with the adjustable voltage divider 63. In the modulator 33 there are also arranged two capacitors 68 and 69, and between the base and the emitter of the transistor 57 there is arranged a resistor 70. The operating d.c. voltage for the three transistors 55, 56 and 57 is referenced U.

Although I have described my invention by reference to particular illustrative embodiments thereof, many changes and modifications thereof may become apparent to those skilled in the art without departing from the spirit and scope of the invention. I therefore intend that the patent warranted hereon cover all such changes and modifications as may reasonably and properly be included within the scope of my contribution to the art.

I claim:
1. A pulse-modulated, high-frequency transmitter, comprising:
 a self-sustained oscillator including a transistor having a grounded base, an emitter and a collector, a feedback circuit connected between said collector and said emitter including a strip line and a capacitor in series with said strip line, said strip line having a length equal to half the wavelength of the frequency of oscillation; and
 keying means including a pulse modulator constructed as a constant current source connected to said emitter, and a pulse generator for keying said pulse modulator.
2. The transmitter of claim 1, comprising at least one other transistor having a grounded base, a collector connected to the collector of the first-mentioned transistor and an emitter connected to said constant current source.
3. The transmitter of claim 1, as a secondary radar transmitter for interrogation and answer devices.
 * * * * *